(12) United States Patent
Wagoner et al.

(10) Patent No.: US 9,048,831 B2
(45) Date of Patent: Jun. 2, 2015

(54) SYSTEMS AND METHODS FOR REGULATING SEMICONDUCTOR DEVICES

(75) Inventors: Robert Gregory Wagoner, Roanoke, VA (US); Todd David Greenleaf, Salem, VA (US); Alan Carroll Lovell, Roanoke, VA (US)

(73) Assignee: General Electric Company, Schenectady, NY (US)

(*) Notice: Subject to any disclaimer, the term of this patent is extended or adjusted under 35 U.S.C. 154(b) by 13 days.

(21) Appl. No.: 13/549,371

(22) Filed: Jul. 13, 2012

(65) Prior Publication Data

US 2014/0015571 A1 Jan. 16, 2014

(51) Int. Cl.
H03K 17/60 (2006.01)
H03K 17/16 (2006.01)
H03K 17/14 (2006.01)

(52) U.S. Cl.
CPC .............. *H03K 17/168* (2013.01); *H03K 17/14* (2013.01); *H03K 17/166* (2013.01)

(58) Field of Classification Search
USPC .......................................................... 327/432
See application file for complete search history.

(56) References Cited

U.S. PATENT DOCUMENTS

| | | | | |
|---|---|---|---|---|
| 4,721,869 | A * | 1/1988 | Okado ............................ | 326/14 |
| 6,614,288 | B1 * | 9/2003 | Dagan et al. .................... | 327/365 |
| 6,727,516 | B2 * | 4/2004 | Katoh et al. ..................... | 257/47 |
| 6,972,611 | B1 * | 12/2005 | Thalheim ........................ | 327/434 |
| 7,405,528 | B2 * | 7/2008 | Ho et al. ................... | 318/400.25 |
| 2005/0077927 | A1 * | 4/2005 | Westcott ......................... | 327/110 |
| 2008/0106327 | A1 * | 5/2008 | Meijer et al. ................... | 327/540 |
| 2009/0192634 | A1 * | 7/2009 | Fujinaka ........................... | 700/42 |
| 2010/0060326 | A1 * | 3/2010 | Palmer et al. .................. | 327/109 |
| 2010/0090728 | A1 * | 4/2010 | Logiudice et al. ............. | 327/108 |

OTHER PUBLICATIONS

Park et al., Flexible dv/dt and di/dt Control Method for Insulated Gate Power Switches, IEEE Transactions on Industry Applications, vol. 39, No. 3, May/Jun. 2003.
LeFranc et al., State of the Art of dv/dt and di/dt Control of Insulated Gate Power Switches, Proceedings of the Conference Captech IAP1, Power Supply and Energy Management for Defence Applications, 2007, Bruxelles, Belgium.
Lobsiger, Yanick et al., Closed-Loop IGBT Gate Drive Featuring Highly Dynamic di/dt and dv/dt Control, Proceedings of the IEEE Energy Conversion Congress and Exposition, Sep. 15-20, 2012, pp. 4754-4761, Raleigh, USA.

* cited by examiner

*Primary Examiner* — Lincoln Donovan
*Assistant Examiner* — Patrick Chen
(74) *Attorney, Agent, or Firm* — Fletcher Yoder, P.C.

(57) ABSTRACT

A system for regulating semiconductor devices may include a current regulator configured to regulate one or more currents provided to an insulated gate bipolar transistor (IGBT). The current regulator may regulate the currents by generating a current profile based at least in part on a collector voltage value associated with the IGBT, a rate of collector voltage change value associated with the IGBT, or any combination thereof. The current profile may include one or more current values to be provided to a gate of the IGBT such that the current values are configured to limit the rate of collector voltage change to a first value. The current regulator may then send the one or more current values to a current source configured to supply the gate of the IGBT with one or more currents that correspond to the one or more current values.

17 Claims, 4 Drawing Sheets

SYSTEMS AND METHODS FOR REGULATING SEMICONDUCTOR DEVICES

BACKGROUND OF THE INVENTION

The subject matter disclosed herein relates to regulating current provided to semiconductor devices. More specifically, the subject matter disclosed herein relates to regulating gate drive currents provided to an insulated gate bipolar transistor (IGBT).

In general, energy markets, such as the renewable energy markets, rely on semiconductor devices (e.g., IGBTs) to perform various power conversion operations. In order to operate these IGBTs, a current is provided to the gates of the IGBTs via gate driver circuits. Typically, gate driver circuits include a voltage source with a current-limiting, fixed value resistor in series with the gate of the IGBT. As such, each gate driver circuit may use one resistor with its voltage source to provide a turn on signal to the IGBT and another resistor with its voltage source to provide a turn off signal to the IGBT. The values for both of these resistors are determined based on the operating limits of the corresponding IGBT and various IGBT performance factors such as minimizing switching losses, electromagnetic emissions, and gate oscillations in the IGBT. However, as IGBTs become more capable of switching faster (i.e., hard-switching), the IGBTs' gate drive circuits' resistors may not adequately prevent current and voltage transients on the IGBTs from generating electromagnetic emissions, which may cause various problems in the IGBT.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a current regulator configured to regulate one or more currents provided to an insulated gate bipolar transistor (IGBT) by receiving a collector voltage value associated with the IGBT, a rate of collector voltage change value associated with the IGBT, or any combination thereof. The current regulator may then generate a current ramp profile based at least in part on the collector voltage value, the rate of collector voltage change value, or any combination thereof. The current ramp profile may include one or more current values to be provided to a gate of the IGBT such that the current values are configured to limit the rate of collector voltage change to a first value. The current regulator may then send the one or more current values to a current source that may supply the gate of the IGBT with one or more currents that correspond to the one or more current values.

In a second embodiment, a non-transitory computer-readable medium may include codes with instructions for receiving information comprising a collector voltage value associated with an insulated gate bipolar transistor (IGBT), a rate of collector voltage change value associated with the IGBT, a collector current associated with the IGBT, an ambient temperature associated with the IGBT, or any combination thereof. The instructions may also include generating a current ramp profile based at least in part on the information such that the current ramp profile may include one or more current values to be provided to a gate of the IGBT. Here, the current values may limit the collector voltage to a first value. The instructions may then include sending the one or more current values to a current source configured to supply the gate of the IGBT with one or more currents that correspond to the one or more current values.

In a third embodiment, a method includes receiving information pertaining to a collector voltage value associated with an insulated gate bipolar transistor (IGBT), a rate of collector voltage change value associated with the IGBT, a collector current associated with the IGBT, an ambient temperature associated with the IGBT, or any combination thereof. The method may then include generating a current ramp profile based at least in part on the information such that the current ramp profile may include one or more current values to be provided to a gate of the IGBT. The current values may be configured to limit the rate of collector voltage change to a first value, limit the collector voltage to a second value, or any combination thereof. The method may then include sending the one or more current values to a current source configured to supply the gate of the IGBT with one or more currents that correspond to the one or more current values

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure generally relates to an adaptive current regulator that may be used to learn the behavior of an IGBT in a power converter and provide gate drive currents to the IGBT that enable the IGBT and the corresponding power converter to operate more efficiently. In one embodiment, the adaptive current regulator may determine the gate drive currents to provide to the IGBT based on the safe operating area (SOA) margin of the IGBT and various operating properties of the IGBT. The adaptive current regulator may store its calculated gate drive currents in a lookup table of gate drive current values. The lookup table may be indexed according to the various operating properties of the IGBT such as the IGBT's rate of collector voltage change ($dV_c/dt$), collector current ($I_c$), collector voltage ($V_c$), ambient temperature ($T_{amb}$), and the like. Initially, the lookup table may be populated with conservative gate drive current values based on the operating specifications of the IGBT. As the IGBT switches on and off, the adaptive current regulator may incrementally adjust each lookup table cell value towards a target rate of collector voltage change and a target collector voltage limit, which may limit high transient voltages that may occur when the IGBT switches. These high transient voltages may cause the IGBT to generate electromagnetic emissions, resulting in thermal problems within the IGBT, lengthen design cycles, and the like.

Figure 1:
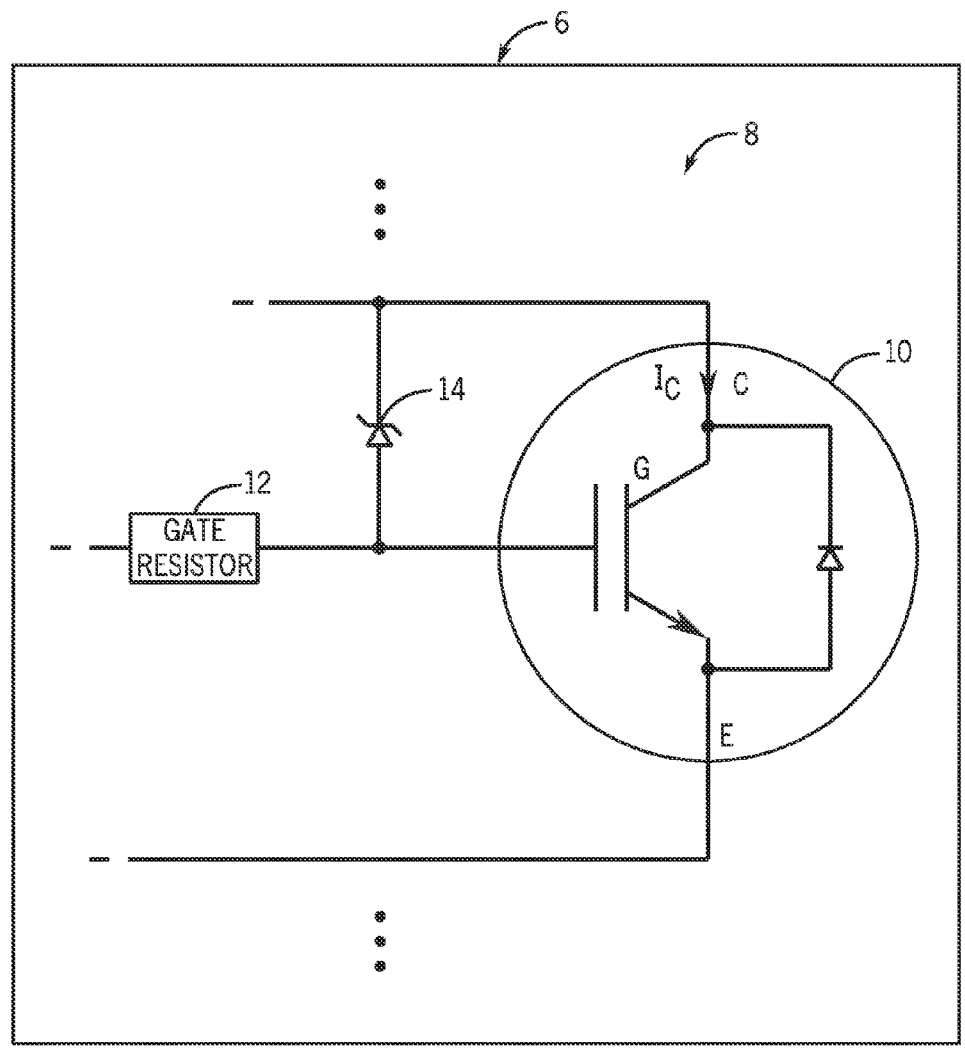
FIG. 1 depicts a schematic diagram of an embodiment of an active clamp circuit for an insulated gate bipolar transistor (IGBT)

In one embodiment, an active clamp circuit may be used to protect the IGBT from damage that may occur due to this high peak collector voltage. For instance, FIG. 1 depicts a power converter system 6 that may use an active clamp circuit 8 to protect an IGBT 10 from damage caused by a high peak collector voltage. Referring to FIG. 1, the active clamp circuit 8 may include IGBT 10, gate resistor 12, and zener diode 14. Typically, the active clamp circuit 8 is designed such that the value for gate resistor 12 is determined based on balancing the operating limits of the corresponding IGBT and various IGBT performance factors, the resulting active clamp circuit 8 may be capable of producing high peak collector voltage values that exceed a collector voltage limit, as specified by the manufacturer of the IGBT 10.

In one embodiment, the zener diode 14 may be connected between the collector (C) and the gate (G) of the IGBT 10 such that if the voltage at the collector(s) exceeds the breakdown voltage threshold of the zener diode 14, the zener diode 14 may conduct current from the collector (C) of the IGBT 10 into the gate (G) of the IGBT 10. Current flowing through zener diode 14 from the collector (C) to the gate (G) of the IGBT 10 may increase a gate voltage ($V_g$) of the IGBT 10, which may cause the IGBT 10 to conduct more current ($I_e$) thereby decreasing a turn-off rate of collector voltage change ($dV_c/dt$). As a result, the active clamp circuit 8 may effectively clamp the peak collector voltage at approximately the breakdown voltage threshold of the zener diode 14. In this manner, the zener diode 14 may be selected such that its breakdown voltage threshold may be lower than the collector voltage limit of the IGBT 10. In certain embodiments, instead of using just one zener diode 14, the peak collector voltage may be clamped using a series string of zener diodes or a number of diodes whose cumulative breakdown voltage (zener voltage) meets a desired detection voltage in place of the zener diode 14.

Although the active clamp circuit 8 may be used to protect the IGBT 10 from damage during turn-off caused by a high peak collector voltage, the active clamp circuit 8 should always be active even when its corresponding power converter system 6 is not. In this manner, the active clamp circuit 8 may not provide an efficient means for protecting the IGBT 10 because it is continuously operating even when the IGBT 10 that it is protecting is not operating. Furthermore, the active clamp circuit 8 may not protect fast-switching IGBTs because its single parameter, the resistance value of the gate resistor 12, is selected as a compromise between performance of the corresponding power converter and the stable gate drive operation for all states of the power converter.

Figure 2:
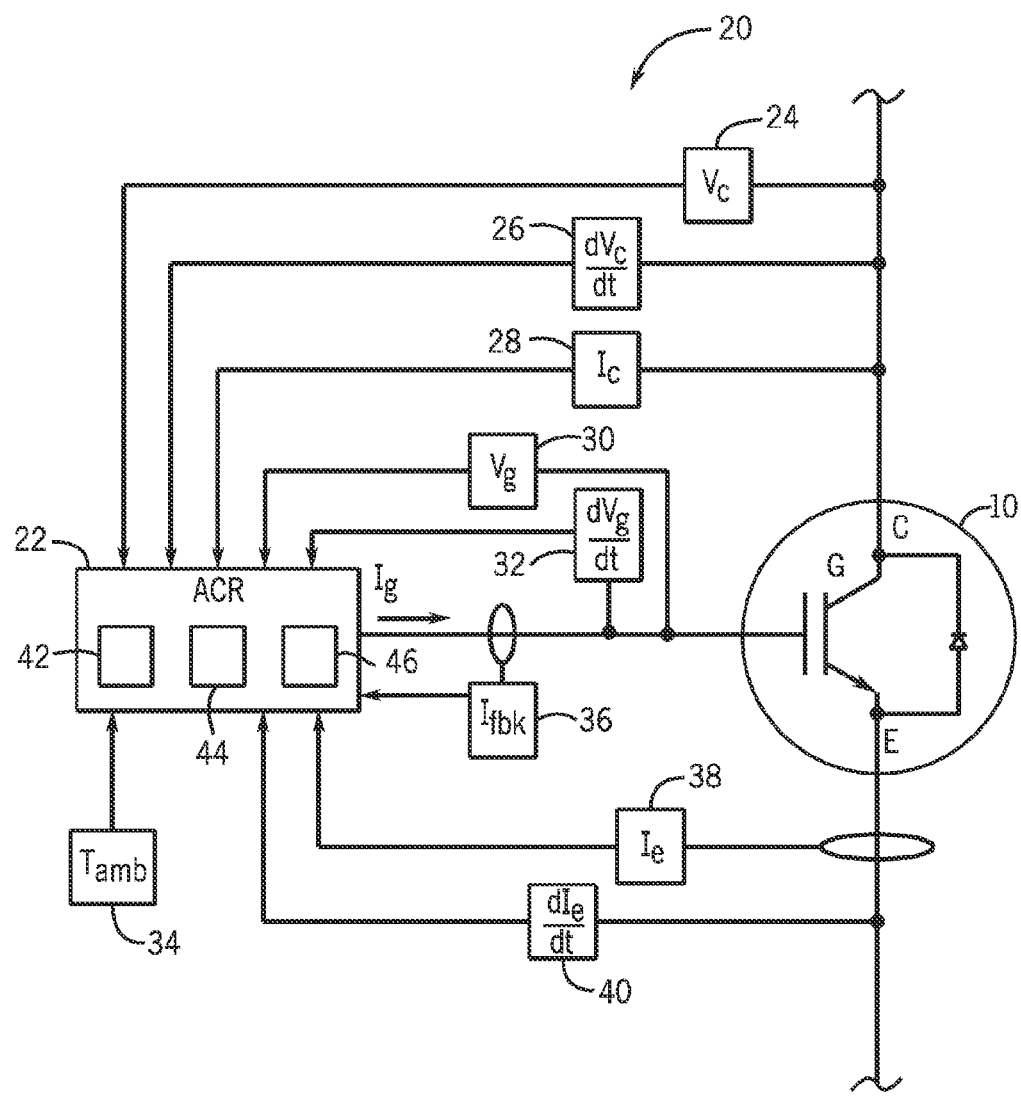
FIG. 2 depicts a block diagram of an embodiment that illustrates input parameters for an adaptive current regulator of an IGBT.

Keeping the foregoing in mind, FIG. 2 depicts a block diagram 20 of an adaptive current regulator 22 and various input parameters for the adaptive current regulator 22 that may be used to regulate gate drive currents provided to the IGBT 10. In one embodiment, the adaptive current regulator 22 may adjust the gate drive currents provided to the gate (G) of the IGBT 10 based on input parameters such as, for example, the collector voltage 24 ($V_c$), the rate of collector voltage change 26 ($dV_c/dt$), the collector current 28 ($I_c$), the gate voltage 30 ($V_g$), the rate of gate voltage change 32 ($dV_g/dt$), the ambient temperature 34 ($T_{amb}$), the gate current feedback 36 ($I_{fbk}$), the emitter current 38 ($I_e$), the rate of emitter current change 40 ($dI_e/dt$), and the like. Additional details with regard to how the adaptive current regulator 22 may adjust the gate drive currents provided to the IGBT 10 will be provided later with reference to FIG. 5.

As mentioned above, the adaptive current regulator 22 may maintain a lookup table of gate drive current values that may be provided to the gate (G) of the IGBT 10. The lookup table may be indexed according to the input parameters described above such as, for example, the collector voltage 24 ($V_c$) the rate of collector voltage change 26 ($dV_c/dt$), the collector current 28 ($I_c$), and the ambient temperature 34 ($T_{amb}$). In one embodiment, the adaptive current regulator 22 may maintain the lookup table of gate drive currents using a processor 42, a memory 44, input/output (I/O) ports 46, field-programmable gate array (FPGA), complex programmable logic device (CPLD), programmable logic device (PLD), application-specific integrated circuit (ASIC), any other reprogrammable device or fixed logic device, and the like. The processor 42 may be any type of computer processor or microprocessor and may include devices such as a system on a chip (SoC), FPGA, CPLD, ASIC, and the like. The memory 44 may include storage and may be configured to store computer executable code and/or the lookup table that may be used by the processor 44 to perform the presently disclosed techniques. The memory 44 may be a non-transitory computer-readable medium.

In one embodiment, the adaptive current regulator 22 may initially populate the lookup table with conservative gate drive current values that closely emulate gate drive current values provided by a conventional gate driver (i.e., using conventional gate resistors). As the IGBT 10 operates, the adaptive current regulator 22 may adjust the lookup table cell values incrementally (e.g., after each switching operation) until a target rate of collector voltage change value and a target collector voltage value are reached. The target rate of collector voltage change and collector voltage values may correspond to a maximum collector voltage change value and a collector voltage overshoot limit value as specified by the manufacturer of the IGBT 10. In other words, the adaptive current regulator 22 may adjust the gate drive current values in the lookup table to control the rate of collector voltage change ($dV_c/dt$) and limit the overshoot of the collector voltage ($V_c$). As a result, the lookup table may include gate drive current values for a full matrix of indexes (e.g., $dV_c/dt$, $V_c$, $I_c$, and $T_{amb}$) that may enable the IGBT 10 to operate efficiently.

The adaptive current regulator may then send the gate drive current values to a current source coupled to a gate of the IGBT-10.

Figure 3:
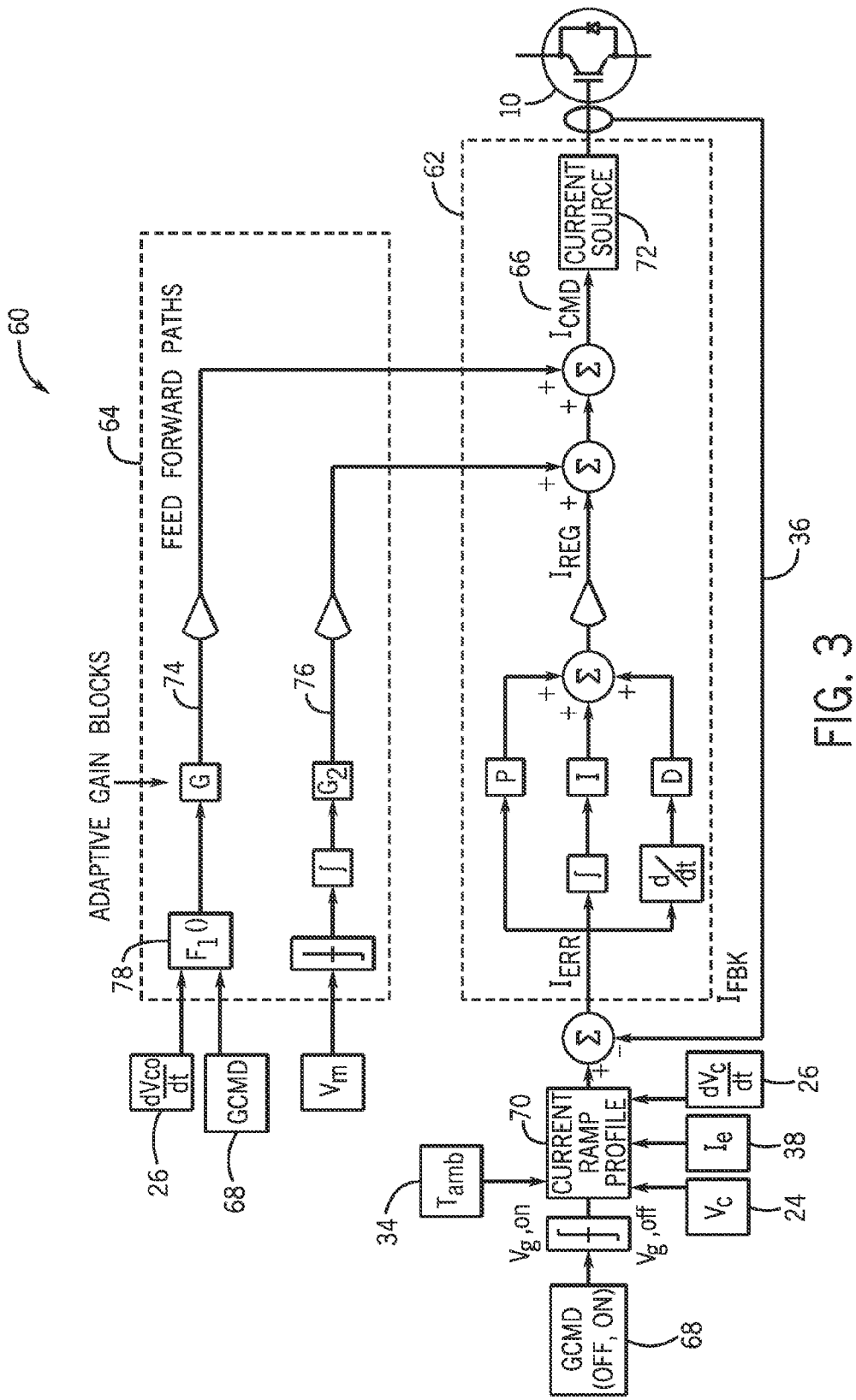
FIG. 3 depicts a block diagram of an embodiment of a control scheme for providing a gate drive current to an IGBT using the adaptive current regulator of FIG. 2.

Keeping the foregoing in mind, FIG. 3 depicts a block diagram 60 of a control scheme that may be used by the adaptive current regulator 22 to determine gate drive currents that may enable the IGBT 10 to switch efficiently. In one embodiment, the control scheme of FIG. 3 may include a proportional-integral-derivative (PID) regulator 62 and an active clamp feed-forward control 64. As shown in FIG. 3, the PID regulator 62 may work in a closed loop to minimize the error between a gate current command 66 ($I_{cmd}$) and a measured gate current 36 ($I_{fbk}$).

In one embodiment, when the adaptive current regulator 22 receives a gate command 68 ($G_{cmd}$) to turn the IGBT 10 on, the adaptive current regulator 22 may initialize a current ramp profile 70 such that the current command 66 may be set to a reference level. The reference level may be a current value that corresponds to a value used to switch the IGBT 10 on using a turn-on gate resistor. The turn-on gate resistor value may be specified by the manufacture of the IGBT 10 as a value that limits the amount of electromagnetic radiation emitted by the IGBT 10. By providing the reference level current to the IGBT 10, the adaptive current regulator 22 may avoid generating a transient collector voltage that exceeds a collector voltage limit, as specified by the manufacturer of the IGBT 10. However, by simply using the reference level current to operate the IGBT 10, the IGBT 10 may not be operating at its maximum efficiency level and may experience high switching power losses.

To increase the efficiency of the IGBT 10, as the adaptive current regulator 22 receives additional gate commands 68 that switches the IGBT 10 off and on, the adaptive current regulator 22 may adjust the current provided to the IGBT 10 using a current source 72 at different times during a gate-on or gate-off profile. In one embodiment, the adaptive current regulator 22 may adjust the current provided to the gate of the IGBT 10 by adjusting the current ramp profile 70 based on, for example, the emitter current 38, the collector voltage 24, the rate of collector voltage change 26, and the ambient temperature 34. As such, the adaptive current regulator 22 may make incremental changes to the current ramp profile 70 to minimize switching losses in the IGBT 10 without causing the rate of collector voltage change 26 ($dV_c/dt$) to exceed a rate of collector voltage change limit, which may be specified by the manufacturer of the IGBT 10.

Figure 4:
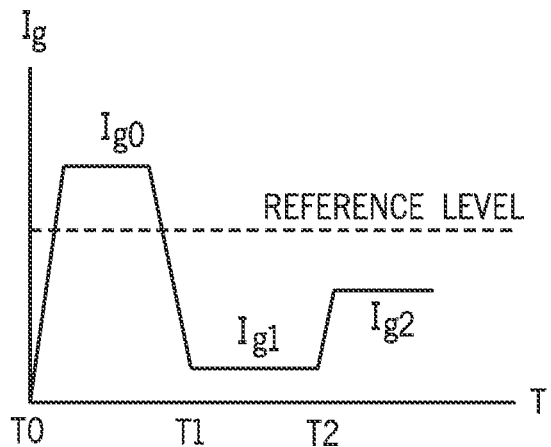
FIG. 4 depicts a block diagram of an embodiment of a current ramp profile provided to the adaptive current regulator of FIG. 2.

After a number of incremental changes have been made to the current ramp profile 70, the current ramp profile may resemble a profile similar to that illustrated in FIG. 4. Referring to FIG. 4, the altered current ramp profile may include three distinct current values ($I_{g0}$, $I_{g1}$, $I_{g2}$) during three distinct time periods (t0-t1, t1-t2, t2). The time periods may be measured relative to a change in gate command 68 (e.g., on-to-off, off-to-on). During the first time period (t0-t1), the current value Ig0 may charge a gate capacitor of the IGBT 10. During the second time period (t1-t2), the current value Ig1 may correspond to a low current value where the rate of emitter current change ($dI_e/dt$) and the rate of collector voltage change ($dV_c/dt$) may be high due the IGBT 10 switching. During the third time period (t2), the current value Ig3 may generate a gate voltage level that may be used to drive the IGBT 10.

In one embodiment, the adaptive current regulator 22 may store a number of altered current ramp profiles in a lookup table based on, for example, the emitter current 38, the collector voltage 24, the rate of collector voltage change 26, and the ambient temperature 34. That is, the lookup table may be indexed according to, for example, the emitter current 38, the collector voltage 24, the rate of collector voltage change 26, and the ambient temperature 34. In this manner, the adaptive current regulator 22 may quickly identify the appropriate current command 66 to send to the current source 72, based on, for example, the emitter current 38, the collector voltage 24, the rate of collector voltage change 26, and the ambient temperature 34. As a result, the IGBT 10 may switch and operate more efficiently.

In one embodiment, the adaptive current regulator 22 may use adaptive gain blocks (e.g., P, I, D) in the PID regulator 62 to further assist the IGBT 10 to operate more efficiently. For example, gain P, in the proportional path of the PID regulator 62, may provide damping to compensate for gate ringing in the IGBT 10. Additionally, gain I, in the integral path of the PID regulator 62, may compensate for a gate capacitance and various non-idealities of the current source 72. In the same fashion, gain D, in the derivative path, of the PID regulator 62 may be used to provide additional damping for gate ringing in the case that gain P is not sufficiently damping the gate ringing.

In addition to compensating for gate ringing in the IGBT 10, gain P may minimize gate current oscillations in the IGBT 10. Here, the adaptive current regulator 62 may store adjustment values for the gain P in a lookup table or matrix similar to the lookup table described above. Using the adjustment values for the gain P, the adaptive current regulator 22 may minimize the gate current oscillations by adjusting the gain P in a cycle of an adaptive feedback loop, monitoring the effect of the change, and adjusting the gain P higher or lower until the desired level of gate current oscillation reduction is achieved. In one embodiment, the adaptive current regulator 22 may continuously track the gate current oscillation and minimize by adjusting the gain P value as described above.

In one embodiment, the adaptive current regulator 22 may minimize gate current oscillations by monitoring the gate current feedback 36 ($I_{fbk}$). For instance, after initializing the current ramp profile 70 as described above, the adaptive current regulator 22 may detect the gate current oscillations from the gate current feedback 36 and determine whether the gate current oscillations are greater than some threshold value. If gate current oscillations are indeed greater than the threshold (i.e., detected), the adaptive current regulator 22 may adjust the gate drive current such that the gate current oscillations are minimized by overriding the currents specified in the current ramp profile 70. However, in certain embodiments, the adaptive current regulator 22 may prioritize operating the IGBT 10 according to the current ramp profile 70 over minimizing the gate current oscillations. As such, the adaptive current regulator 22 may operate the IGBT 10 according to the current ramp profile 70 even if the gate current oscillations are greater than the threshold.

As mentioned above, gain I, in the integral path of the PID regulator 62, may compensate for a gate capacitance and various non-idealities of the current source 72. For instance, as the gate capacitance charges, the adaptive current regulator 22 may need to provide increase the current command 66 to force a change in the current output by the current source 72 due to nonlinearities in the current source 72, which may cause a lag in current response time. Here, the integral path may accumulate an error that may be used to smooth changes in the output of the adaptive current regulator 22.

Referring now to gain D in the derivative path of the PID regulator 62, in one embodiment, gain D may act on the rate of change of $I_{ERR}$ or the gate voltage ($V_g$) to counteract rapid oscillations that may be occurring in gate current ($I_g$). As such, gain D may be used to provide additional damping for gate ringing when gain P does not sufficiently damp the gate ringing.

In addition to providing current values to the IGBT 10 based on the current ramp profile 70, the adaptive current regulator 22 may use the active clamp feed-forward control 64 to override the current values provided by the current ramp profile 70 and provide additional protection for the IGBT 10. For instance, the active clamp feed-forward control 64 may include feed-forward path 74 and feed-forward path 76 to provide additional safeguards such that the collector voltage ($V_c$) does not exceed the collector voltage limit, as specified by the manufacturer of the IGBT 10.

In one embodiment, the feed-forward path 74 may include a function 78 that may provide a voltage clamp to ensure that the collector voltage ($V_c$) does not exceed the collector voltage limit. In one embodiment, the function 74 may mimic the operation of the zener diode 14 in the active clamp circuit 8 of FIG. 1. In order to mimic the active clamp circuit 8, the function 74 may receive the gate command 68 and the rate of collector voltage change 26 and determine whether to clamp the gate voltage of the IGBT 10 based on the rate of the collector voltage change 26. For instance, as the rate of the collector voltage change 26 increases, the function 74 may output a current value that may alter the current command 66 such that the collector voltage 24 is adequately clamped below the collector voltage limit.

In addition to monitoring the rate of collector voltage change 26, the feed-forward path 76 may monitor a difference between the collector voltage 24 and collector voltage limit ($V_m$). In one embodiment, if the difference between the collector voltage 24 and collector voltage limit ($V_m$) is greater than zero, the feed-forward path 76 may output a current value that may alter the current command 66 such that the collector voltage is adequately clamped below the collector voltage limit.

In one embodiment, gain G1 and gain G2 may determine the relative weight of the feed-forward paths to override the current ramp profile 70. Generally, the current ramp profile 70 may be in a negative or decreasing state (e.g., gate-off) when the feed-forward path becomes active (i.e., clamping region). When the current ramp profile 70 is initialized, the adaptive current regulator 22 may not implement the feed-forward paths (74 and 76) because the IGBT 10 will be operating at the reference current level which corresponds to the Safe Operating Area (SOA) margin of the IGBT 10, as per the manufacturer of the IGBT 10. However, as the current ramp profile 70 adjusts, the adaptive current regulator may increase a corresponding gain in order to increase the rate of collector voltage change ($dV_c/dt$). As such, as the current ramp profile 70 becomes more aggressive, the adaptive current regulator 22 may increase gain G1 in order to provide more "lead" in anticipating a situation in which the IGBT 10 may encounter a collector voltage that exceeds the collector voltage limit (i.e., overvoltage). Here, the adaptive current regulator 22 may increase gain G1 such that it may become effective earlier in the rise of the collector voltage 24. Since the feed-forward path 74 may effectively anticipate most overvoltage scenarios as described above, the adaptive current regulator 22 may generally set gain G2 as inactive. However, in certain embodiments, the adaptive current regulator 22 may use gain G2 as an additional safeguard to quickly clamp the collector voltage 24 when the collector voltage exceeds the collector voltage limit.

Figure 5:
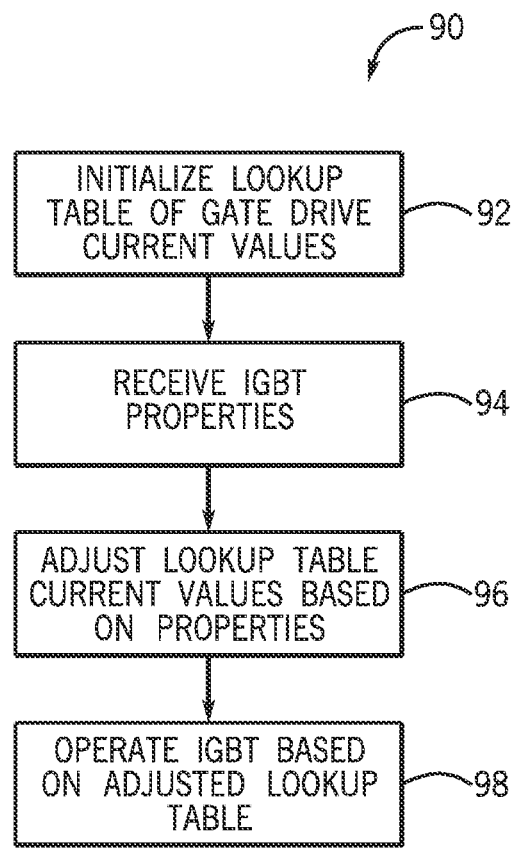
FIG. 5 depicts a flow diagram of an embodiment of a method for providing a gate drive current to an IGBT using the adaptive current regulator of FIG. 2.

Keeping the foregoing in mind, FIG. 5 depicts a method 90 that may be used to provide a gate drive current to an IGBT 10. In one embodiment, method 90 may be performed by the adaptive current regulator 22 described above.

At block 92, the adaptive current regulator 22 may initialize a lookup table of gate drive current values for an IGBT as described above. The lookup table may be indexed according to various voltage, current, and/or ambient temperature properties associated with the corresponding IGBT as described above. In one embodiment, the adaptive current regulator 22 may set the initialized gate drive current values as conservative gate drive current values that closely emulate the gate drive current values that may be provided by a conventional gate driver using gate resistors as specified by the manufacturer of the IGBT.

At block 94, the adaptive current regulator 22 may receive voltage, current, and/or ambient temperature properties associated with the corresponding IGBT. For instance, the adaptive current regulator 22 may receive, for example, information related to the collector voltage 24 ($V_c$), the rate of collector voltage change 26 ($dV_c/dt$), the collector current 28 ($I_c$), the gate voltage 30 ($V_g$), the rate of gate voltage change 32 ($dV_g/dt$), the ambient temperature 34 ($T_{amb}$), the gate current feedback 36 ($I_{g,fbk}$), the emitter current 38 ($I_e$), the rate of emitter current change 40 ($dI_e/dt$), and the like.

At block 96, the adaptive current regulator 22 may adjust the current values in the lookup table entries based on the properties associated with the IGBT. In one embodiment, the adaptive current regulator 22 may adjust the lookup table entries incrementally (e.g., after each switching operation) to control the rate of collector voltage change ($dV_c/dt$) and limit the overshoot of the collector voltage ($V_c$), as described above with reference to FIG. 2.

In this manner, the adaptive current regulator 22 may adjust the lookup table entries adaptively based on the properties received at block 94 such that the rate of collector voltage change ($dV_c/dt$) and the collector voltage ($V_c$) of the IGBT reach target values. For example, at each switching event in the IGBT, the adaptive current regulator 22 may make an adjustment to the lookup table entries which effect the next similar switching event by a 1% change closer to the desired IGBT behavior. In this example, after a number of such switching events (e.g., 100), the adaptive current regulator 22 may make significant improvements in achieving IGBT behavior that corresponds to the target rate of collector voltage change and collector voltage. By making the changes at such a slow rate, the adaptive current regulator 22 may minimize the errors that may be caused by various noise factors present within the IGBT.

At block 98, the adaptive current regulator 22 may operate the IGBT 10 using the adjusted lookup table determined at block 96. As a result, the adaptive current regulator 22 may enable a power converter to operate more efficiently and provide for gate drive stability within the corresponding IGBTs, simultaneously, in all modes of operation. Further, the adaptive current regulator 22 may allow for a relatively slow, but adaptive, process without requiring adaptive computations to operate inside a fast control loop, which would typically require 10^6 to 10^7 radians of bandwidth. Additionally, the adaptive current regulator 22 may use a single current source, as opposed to multiple current sources required by conventional gate driver circuits. Moreover, the single current source used by the adaptive current regulator 22 may provide for the unification of various inputs such as a gate command, an active clamp current, rate of collector voltage change control, rate of emitter current change control, feed-forward voltage clamps, and the like. The adaptive current regulator 22 may also enable the gate driver of the IGBT to seek an efficient manner in which to control gate voltage and current of the IGBT, as opposed to the design approach of a conventional gate drive, which uses several iterations of test and modification to determine an efficient manner in which to control the IGBT.

Effectively, the adaptive current regulator 22 may enable IGBTs to have fast switching times and efficient power consumption properties during turn-on or turn-off, while simultaneously avoiding voltage overshoot on the IGBT. As such, the adaptive current regulator 22 may provide an active clamp control to minimize overshoot of the collector voltage when the IGBT turns off without using zener diode active clamp circuit. The elimination of the zener diodes generally provides a reliability improvement since zener diodes are susceptible to reliability issues.

In addition to providing an adaptive approach for optimizing the efficiency of the power converter and the Safe Operating Area (SOA) margin of the IGBT, the adaptive current regulator 22 may enable the power converter to also operate within a Safe Operating Area (SOA) margin of a diode contained therein, the peak collector voltage of the IGBT, a peak diode voltage, and the like. Further, the adaptive current regulator 22 may provide for efficient IGBT switching losses, diode reverse recovery losses, or other power semiconductor operating parameters.

Technical effects of the invention include reducing thermal problems in the power converter caused by switching losses within the IGBTs, shortening design cycles, providing for single gate driver design that may be use for various types of IGBT devices, and the like. Further, the adaptive current regulator may obtain measurements of voltage and current of the collector and the gate of the IGBT, these measurements may be analyzed with respect to a signal to noise ratio (SNR).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:
a current regulator having a processor, wherein the current regulator is configured to regulate one or more currents provided to an insulated gate bipolar transistor (IGBT) by:
populating one or more entries in a lookup table with one or more predetermined current values, wherein the one or more predetermined current values are based on a predetermined resistor value that corresponds to a gate of an insulated gate bipolar transistor (IGBT), wherein the predetermined resistor value is based on a type of the IGBT;
receiving, at the processor, a rate of collector voltage change value associated with the IGBT;
generating, at the processor, a current profile based at least in part on the rate of collector voltage change value, wherein the current profile comprises one or more current values to be provided to the gate of the IGBT, wherein the current values are configured to limit the rate of collector voltage change to a first value;
making one or more modifications to the one or more entries based at least in part on the rate of collector voltage change value wherein the modifications are configured to adjust the rate of collector voltage change towards the first value, and wherein the rate of collector voltage change is adjusted by a fixed percentage change each time the IGBT switches; and
sending, from the current regulator, the one or more current values to a current source configured to supply the gate of the IGBT with one or more currents that correspond to the one or more current values.

2. The system of claim 1, wherein the processor is configured to store the one or more current values in the lookup table indexed according to a collector voltage value, the rate of collector voltage change value, or any combination thereof.

3. The system of claim 1, wherein the processor is configured to make the modifications each time the IGBT switches.

4. The system of claim 1, wherein the processor is configured to make the modifications by minimizing power losses in the IGBT when the IGBT switches.

5. The system of claim 1, comprising a storage device having the current profile, wherein the current profile comprises:
a first current value that corresponds to a first current provided to the gate of the IGBT, wherein the first current is configured to charge a gate capacitance of the IGBT;
a second current value that corresponds to a second current provided to the gate of the IGBT, wherein the second current value is lower than the first current value; and
a third current value that corresponds to a third current provided to the gate of the IGBT, wherein the third current is configured to drive the IGBT.

6. The system of claim 5, wherein the first current is provided to the gate of the IGBT for a first duration of time, wherein the second current is provided to the gate for a second duration time after the first duration of time, and wherein the third current is provided to the gate of the IGBT for a third duration of time after the second duration of time.

7. The system of claim 1, wherein the current regulator comprises a proportional-integral-derivative (PID) regulator configured to compensate for ringing in the gate of the IGBT by applying a gain in a proportional path of the PID regulator.

8. The system of claim 1, wherein the current regulator comprises a proportional-integral-derivative (PID) regulator configured to minimize one or more current oscillations in the gate of the IGBT by applying a gain in a proportional path of the PID regulator.

9. The system of claim 1, wherein the current regulator comprises a proportional-integral-derivative (PID) regulator configured to compensate for a gate capacitance of the IGBT by applying a gain in an integral path of the PID regulator.

10. The system of claim 1, wherein the current regulator comprises a proportional-integral-derivative (PID) regulator configured to compensate for ringing in the gate of the IGBT by applying a gain in a derivative path of the PID regulator.

11. The system of claim 1, wherein the processor is configured to clamp the collector voltage of the IGBT when the rate of collector voltage change value exceeds a threshold.

12. A non-transitory computer-readable medium having computer executable code stored thereon, the code comprising instructions configured to:
populate one or more entries in a lookup table with one or more predetermined current values based on a predetermined resistor value that corresponds to a gate of an insulated gate bipolar transistor (IGBT), wherein the predetermined resistor value is based on a type of the IGBT;
receive information comprising a rate of collector voltage change value associated with the IGBT;

modify the one or more entries based at least in part on the rate of collector voltage change value associated with the IGBT, wherein the modified entries are configured to adjust the rate of collector voltage change towards a first value, and wherein the instructions to modify the entries comprises adjusting the one or more entries of the lookup table by a fixed percentage change each time the IGBT switches; and send one or more current values that correspond to the one or more modified entries to a current source configured to supply the gate of the IGBT with one or more currents that correspond to the one or more current values provided in the one or more modified entries.

13. The non-transitory computer-readable medium of claim 12, wherein the code comprising instructions configured to populate the one or more current values in the lookup table comprises indexing the one or more current values according to a collector voltage value associated with the IGBT, the rate of collector voltage change value associated with the IGBT, a collector current associated with the IGBT, an ambient temperature associated with the IGBT, or any combination thereof.

14. The non-transitory computer-readable medium of claim 12, wherein the code comprising instructions configured to modify the one or more entries comprises generating a current profile based on the information and the predetermined current values, wherein the current profile comprises a plurality of current values to be provided to a gate of the IGBT during a plurality of time periods, wherein the plurality of current values is configured to limit the rate of collector voltage change value to the first value.

15. A method for regulating current provided to an insulated gate bipolar transistor (IGBT), comprising:

generating, via a processor, one or more entries in a lookup table, wherein each entry comprises one or more predetermined current values, based on a predetermined resistor value that corresponds to a gate of an insulated gate bipolar transistor (IGBT), wherein the predetermined resistor value is based on a type of the IGBT;

receiving, via the processor, information comprising a rate of collector voltage change value associated with the IGBT;

generating, via the processor, a current profile based at least in part on the information, wherein the current profile comprises one or more current values to be provided to a gate of the IGBT, wherein the current values are configured to limit the rate of collector voltage change to a first value, wherein generating the current profile comprises adjusting the one or more predetermined current values based at least in part on the rate of collector voltage change value, wherein the adjustments are configured to modify the rate of collector voltage change towards the first value by a fixed percentage change each time the IGBT switches; and sending, via the processor, the one or more current values to a current source configured to supply the gate of the IGBT with one or more currents that correspond to the one or more current values.

16. The method of claim 15, wherein generating the one or more entries via the processor comprises determining the one or more predetermined current values for each entry based at least in part on a gate resistor value associated with the IGBT and one or more indexes in the lookup table.

17. The method of claim 16, wherein the one or more indexes comprise a collector voltage value associated with the IGBT, the rate of collector voltage change value associated with the IGBT, a collector current associated with the IGBT, an ambient temperature associated with the IGBT, or any combination thereof.

* * * * *